(12) United States Patent
Yeon et al.

(10) Patent No.: US 11,653,570 B2
(45) Date of Patent: May 16, 2023

(54) DISPLAY DEVICE AND PIEZOELECTRIC SENSOR

(71) Applicant: LG Display Co., Ltd., Seoul (KR)

(72) Inventors: DeukHo Yeon, Seoul (KR);
TaeHyoung Moon, Gyeonggi-do (KR);
JaeHyun Kim, Gyeonggi-do (KR);
Sungjin Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 268 days.

(21) Appl. No.: 16/902,127

(22) Filed: Jun. 15, 2020

(65) Prior Publication Data

US 2020/0403140 A1    Dec. 24, 2020

(30) Foreign Application Priority Data

Jun. 19, 2019   (KR) .................... 10-2019-0073074

(51) Int. Cl.
| | |
|---|---|
| *H01L 41/113* | (2006.01) |
| *G01H 11/08* | (2006.01) |
| *H01L 41/08* | (2006.01) |
| *H01L 41/047* | (2006.01) |

(52) U.S. Cl.
CPC .......... *H01L 41/1132* (2013.01); *G01H 11/08* (2013.01); *H01L 41/0474* (2013.01); *H01L 41/081* (2013.01)

(58) Field of Classification Search
CPC ....... H01L 41/02; H01L 41/04; H01L 41/042; H01L 41/053; H01L 41/0533; H01L 27/20; H01L 27/32; H01L 27/3225; H01L 27/323; H01L 41/1132; H01L 41/0474; H01L 41/081; G01H 11/08
See application file for complete search history.

(56) References Cited

U.S. PATENT DOCUMENTS

| | | | | |
|---|---|---|---|---|
| 2013/0309791 | A1* | 11/2013 | Bedell | .................... H01L 21/84 257/E33.056 |
| 2019/0163314 | A1* | 5/2019 | Kim | .................... G06F 3/04164 |
| 2020/0410195 | A1* | 12/2020 | Kim | .................... G06V 40/1306 |
| 2020/0410196 | A1* | 12/2020 | Moon | .................... H01L 27/3265 |

* cited by examiner

*Primary Examiner* — Eduardo A Rodela
(74) *Attorney, Agent, or Firm* — Seed IP Law Group LLP

(57) ABSTRACT

A piezoelectric sensor includes: a lower substrate; a plurality of sensing transistors that are disposed on the lower substrate; a lower electrode that is disposed to cover the plurality of sensing transistors; a piezoelectric material layer that is disposed on the lower electrode; and an upper electrode that is disposed on the piezoelectric material layer. The piezoelectric material layer has a first thickness in a plurality of first areas in which the plurality of sensing transistors are disposed and has a second thickness which is greater than the first thickness in a second area in which the plurality of sensing transistors are not disposed. Accordingly, it is possible to further accurately and finely detect various types of biometric information.

23 Claims, 16 Drawing Sheets

DISPLAY DEVICE AND PIEZOELECTRIC SENSOR

CROSS REFERENCE TO RELATED APPLICATION

This application claims priority from Korean Patent Application No. 10-2019-0073074, filed Jun. 19, 2019, which is hereby incorporated by reference for all purposes as if fully set forth herein.

BACKGROUND

Technical Field

Embodiments of the present disclosure relate to a display device and a piezoelectric sensor.

Description of the Related Art

With advancement in information-oriented societies, requirements for display devices displaying an image have increased, and various types of display devices such as a liquid crystal display device (LCD) and an organic light emitting display device (OLED) have been widely utilized.

Such a display device senses a user's touch or senses biometric information such as a user's fingerprint and provides various application functions based on results of sensing.

Therefore, such a display device includes a sensing device that senses a touch or biometric information such as a fingerprint. Application technology (for example, user authentication or financial transactions) using results of sensing in the display device requires results of sensing with high accuracy or sensing operations of the sensing device with high security. However, existing sensing devices are not satisfactory in sensing accuracy and security.

A sensing device has to be decreased in size or has to sense a large area according to necessity. However, existing sensing devices are not satisfactory in a decrease in size due to a light source or the like or in an increase in sensing area.

BRIEF SUMMARY

The present disclosure provides a piezoelectric sensor that can detect biometric information more accurately and finely.

The present disclosure provides a display device that can accurately perform an application function requiring high security using a piezoelectric sensor that can detect biometric information more accurately and finely.

The present disclosure provides a piezoelectric sensor that can detect more types of biometric information accurately and finely.

The present disclosure provides a display device that can accurately perform various application functions using a piezoelectric sensor that can detect more types of biometric information accurately and finely.

The present disclosure provides a stretchable piezoelectric sensor.

The present disclosure provides a stretchable display device including a stretchable piezoelectric sensor.

According to an aspect of the present disclosure, there is provided a piezoelectric sensor including: a lower substrate; a plurality of sensing transistors that are disposed on the lower substrate; a lower electrode that is disposed to cover the plurality of sensing transistors; a piezoelectric material layer that is disposed on the lower electrode; and an upper electrode that is disposed on the piezoelectric material layer.

The piezoelectric material layer has a first thickness in a plurality of first areas in which the plurality of sensing transistors are disposed and has a second thickness which is greater than the first thickness in a second area in which the plurality of sensing transistors are not disposed.

The second thickness of the piezoelectric material layer may vary when the piezoelectric sensor contracts or stretches.

The second thickness of the piezoelectric material layer may decrease when the piezoelectric sensor stretches and the second thickness of the piezoelectric material layer may increase when the piezoelectric sensor contracts.

An amount of change of the second thickness of the piezoelectric material layer may be greater than an amount of change of the first thickness of the piezoelectric material layer when the piezoelectric sensor contracts or stretches.

Ultrasonic waves which are generated in at least one of the plurality of first areas may have a first wavelength and ultrasonic waves which are generated in the second area may have a second wavelength which is different from the first wavelength.

The second wavelength of the ultrasonic waves generated in the second area may be greater than the first wavelength of the ultrasonic waves generated in at least one of the plurality of first areas when the second thickness of the piezoelectric material layer in the second area is greater than the first thickness of the piezoelectric material layer in the plurality of first areas.

The second wavelength of the ultrasonic waves generated in the second area may vary depending on contraction or stretch of the piezoelectric sensor.

The second wavelength of the ultrasonic waves generated in the second area may decrease when the piezoelectric sensor stretches.

The second wavelength of the ultrasonic waves generated in the second area may increase when the piezoelectric sensor contracts.

The piezoelectric material layer may include a flexible material.

The piezoelectric sensor may further include: a lower coating layer that is disposed under the lower substrate and includes a flexible material; and an upper coating layer that is disposed to cover the upper electrode and includes a flexible material.

At least one hole may be formed in the lower electrode or the upper electrode in the second area in which the plurality of sensing transistors are not disposed.

The upper electrode may include: a plurality of upper sensor electrode portions that are disposed in the plurality of first areas in which the plurality of sensing transistors are disposed and are located on the plurality of sensing transistors; a plurality of upper mesh electrode portions that are disposed in the second area in which the plurality of sensing transistors are not disposed and a plurality of holes are formed; and a plurality of upper connection line portions that are disposed in the second area in which the plurality of sensing transistors are not disposed and electrically connects the plurality of upper mesh electrode portions.

The lower electrode may include: a plurality of lower sensor electrode portions that are disposed in the plurality of first areas in which the plurality of sensing transistors are disposed and are located under the plurality of sensing transistors; a plurality of lower mesh electrode portions that are disposed in the second area in which the plurality of sensing transistors are not disposed and a plurality of holes are formed; and a plurality of lower connection line portions that are disposed in the second area in which the plurality of sensing transistors are not disposed and electrically connects the plurality of lower sensor electrode portions.

Ultrasonic waves may be generated in the piezoelectric material layer when a drive signal with a variable voltage level is applied to the upper electrode or the lower electrode.

The ultrasonic waves generated in the piezoelectric material layer may be reflected and transmitted to the piezoelectric sensor.

A state of the piezoelectric material layer may be changed by the transmitted ultrasonic waves and an electrical state of the lower electrode or the upper electrode may change.

At least one of the plurality of sensing transistors may be repeatedly turned on and off to output an electrical signal to a sensing line according to the change in the electrical state of the lower electrode or the upper electrode.

The piezoelectric sensor may further include a sensing circuit that drives the upper electrode or the lower electrode, detects an electrical signal via the sensing line, and detects biometric information on the basis of the detected electrical signal.

A total area of the second area in which the plurality of sensing transistors are not disposed may be greater than a total area of the plurality of first areas in which the plurality of sensing transistors are disposed.

According to another aspect of the present disclosure, there is provided a display device including: a display panel; and a piezoelectric sensor that includes a lower substrate, a plurality of sensing transistors that are disposed on the lower substrate, a lower electrode that is disposed to cover the plurality of sensing transistors, a piezoelectric material layer that is disposed on the lower electrode, and an upper electrode that is disposed on the piezoelectric material layer.

The piezoelectric material layer has a first thickness in a plurality of first areas in which the plurality of sensing transistors are disposed and has a second thickness which is greater than the first thickness in a second area in which the plurality of sensing transistors are not disposed.

The second thickness of the piezoelectric material layer may vary when the piezoelectric sensor contracts or stretches.

Ultrasonic waves which are generated in at least one of the plurality of first areas may have a first wavelength and ultrasonic waves which are generated in the second area may have a second wavelength which is different from the first wavelength.

The second wavelength of the ultrasonic waves generated in the second area may be greater than the first wavelength of the ultrasonic waves generated in at least one of the plurality of first areas when the second thickness of the piezoelectric material layer in the second area is greater than the first thickness of the piezoelectric material layer in the plurality of first areas.

The second wavelength of the ultrasonic waves generated in the second area may vary depending on contraction or stretch of the piezoelectric sensor.

The display device may further include a sensing circuit that drives the upper electrode or the lower electrode, detects an electrical signal via a sensing line which is connected to at least one of the plurality of sensing transistors, and detects biometric information on the basis of the detected electrical signal.

The display panel may include a stretchable substrate and the piezoelectric material layer may be stretchable.

According to another aspect of the present disclosure, there is provided a piezoelectric sensor including: a lower substrate; a plurality of sensing transistors that are disposed on the lower substrate; a lower electrode that is disposed to cover the plurality of sensing transistors; a piezoelectric material layer that is disposed on the lower electrode; and an upper electrode that is disposed on the piezoelectric material layer. A thickness of the piezoelectric material layer in an area in which the plurality of sensing transistors are not disposed varies when the piezoelectric sensor contracts or stretches.

According to another aspect of the present disclosure, there is provided a piezoelectric sensor including: a lower substrate; a plurality of sensing transistors that are disposed on the lower substrate; a lower electrode that is disposed to cover the plurality of sensing transistors; a piezoelectric material layer that is disposed on the lower electrode; and an upper electrode that is disposed on the piezoelectric material layer. At least one hole is formed in the lower electrode or the upper electrode in an area in which the plurality of sensing transistors are not disposed.

According to another aspect of the present disclosure, there is provided a piezoelectric sensor including: a lower substrate; a plurality of sensing transistors that are disposed on the lower substrate; a lower electrode that is disposed to cover the plurality of sensing transistors; a piezoelectric material layer that is disposed on the lower electrode; and an upper electrode that is disposed on the piezoelectric material layer. A wavelength of ultrasonic waves which are generated in an area in which the sensing transistors are disposed and a wavelength of ultrasonic waves which are generated in an area in which the sensing transistors are not disposed are different from each other.

According to the embodiments of the present disclosure, it is possible to provide a piezoelectric sensor that can detect biometric information more accurately and finely with a structure enabling generation of ultrasonic waves of various wavelengths.

According to the embodiments of the present disclosure, it is possible to provide a display device that can accurately perform an application function requiring high security using a piezoelectric sensor that can detect biometric information more accurately and finely.

According to the embodiments of the present disclosure, it is possible to provide a piezoelectric sensor that can detect more types of biometric information accurately and finely with a structure enabling generation of ultrasonic waves of various wavelengths.

According to the embodiments of the present disclosure, it is possible to provide a display device that can accurately perform various application functions using a piezoelectric sensor that can detect more types of biometric information accurately and finely.

According to the embodiments of the present disclosure, it is possible to provide a stretchable piezoelectric sensor with a flexible structure.

According to the embodiments of the present disclosure, it is possible to provide a stretchable display device including a stretchable piezoelectric sensor with a flexible structure.

DETAILED DESCRIPTION OF THE INVENTION

Figure 1:
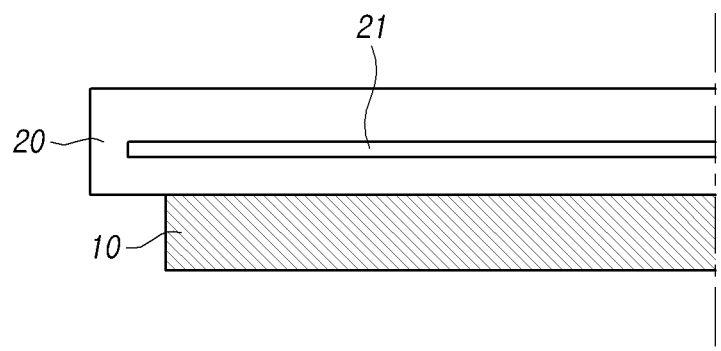
FIG. 1 is a diagram illustrating a display device according to one or more embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

Figure 2:
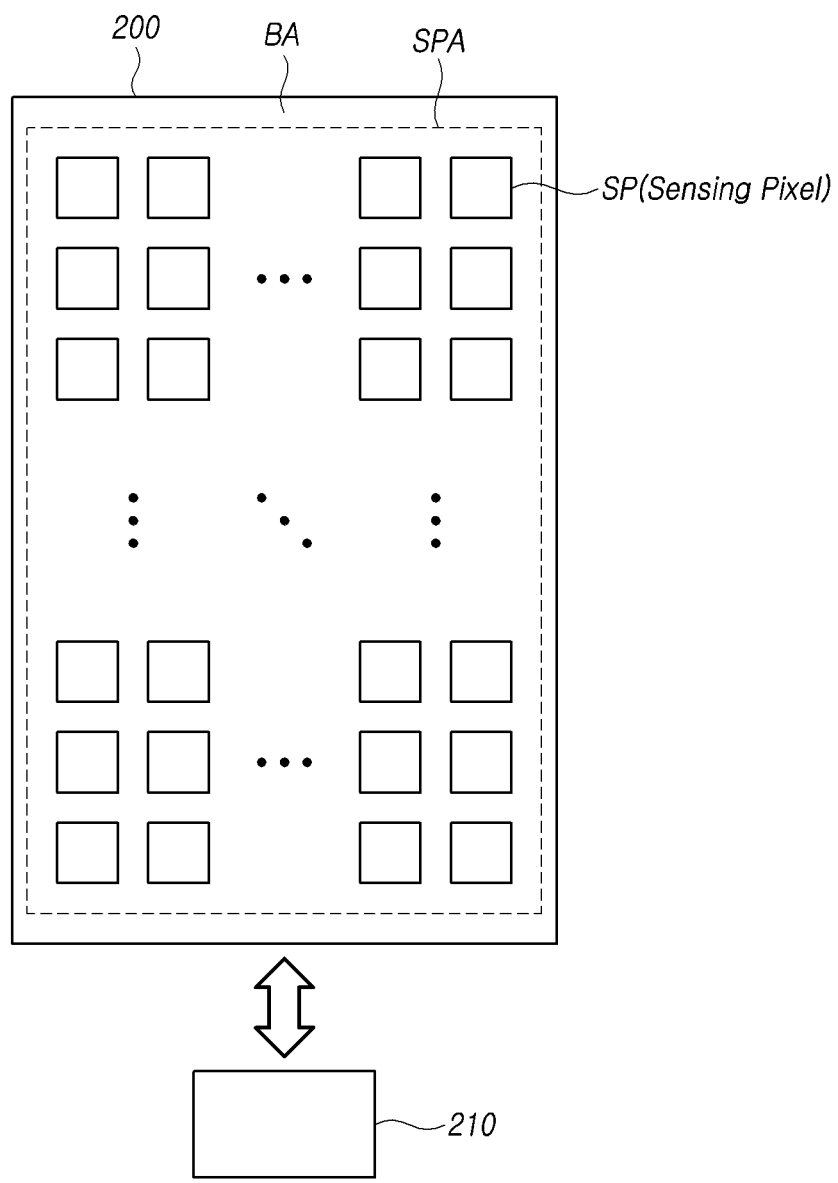
FIG. 2 is a diagram illustrating a piezoelectric sensor according to one or more embodiments of the present disclosure.

FIG. 1 is a diagram illustrating a display device according to one or more embodiments of the present disclosure. FIG. 2 is a diagram illustrating a piezoelectric sensor 10 according to one or more embodiments of the present disclosure.

Referring to FIG. 1, a display device according to one or more embodiments of the present disclosure provides a function of displaying an image and a function of sensing biometric information such as a user's fingerprint (e.g., ridges and valleys of the finger surface), palm lines, or blood vessels in conjunction with execution of various applications.

The display device according to an embodiment of the present disclosure includes a display panel 20 that displays an image and a piezoelectric sensor 10 that senses biometric information.

The display panel 20 includes a substrate 21 and data lines and gate lines that are disposed on the substrate 21. The display panel 20 includes subpixels that display an image.

The display device further includes a drive circuit that drives the display panel 20, and the drive circuit includes a gate driving circuit that drives the gate lines and a data driving circuit that drives the data lines. The drive circuit further includes a controller that controls the gate driving circuit and the data driving circuit.

The display device further includes a touch sensor that senses a touch of a finger or a pen (e.g., electronic pen, digital pen, active, pen, active stylus, digital stylus, etc.). The touch sensor includes a touch panel that includes touch electrodes and a touch sensing circuit that detects a touch or a touched position by driving the touch electrodes for sensing. The touch panel may be located separately outside the display panel or may be incorporated into the display panel.

The piezoelectric sensor 10 is a sensor that senses a user's biometric information and includes a sensing panel 200 including a plurality of sensing pixels SP and a sensing circuit 210 that detects a user's biometric information by driving the sensing panel 200 for sensing.

Each of the plurality of sensing pixels SP includes two electrodes, a piezoelectric element including a piezoelectric material layer that is disposed between the two electrodes, and a pixel circuit that drives the piezoelectric element.

Here, a piezoelectric element is a kind of energy conversion device, that is, a signal generating device that converts electrical energy into another type of energy and generates a signal, and converts a received signal into electrical energy and generates the electrical energy. In some embodiments, a piezoelectric element is also referred to as a transducer. For example, a piezoelectric element may be an ultrasonic piezoelectric element that generates ultrasonic waves on the basis of electrical energy applied to two electrodes and generates electrical energy when ultrasonic waves are received.

The sensing panel 200 of the piezoelectric sensor 10 includes a sensing pixel area SPA in which a plurality of sensing pixels SP are disposed and a bezel area BA which is a peripheral area adjacent to the sensing pixel area SPA. In some embodiments, the bezel area BA surrounds the sensing pixel area SPA.

The piezoelectric sensor 10 is attached to the display panel 20.

For example, the piezoelectric sensor 10 is located under the display panel 20. Here, a part under the display panel 20 may refer to a surface opposite of a viewing surface on which an image is displayed. In some cases, the piezoelectric sensor 10 may be located on a side surface of the display panel 20. In other cases, the piezoelectric sensor 10 may be located on a top surface or the viewing surface of the display panel 20. In these cases, the piezoelectric sensor 10 may be implemented using a transparent material.

The sensing circuit 210 may be bonded to or mounted on the bezel area BA of the sensing panel 200, or may be mounted on a printed circuit which is electrically connected to the bezel area BA of the sensing panel 200.

Figure 3:
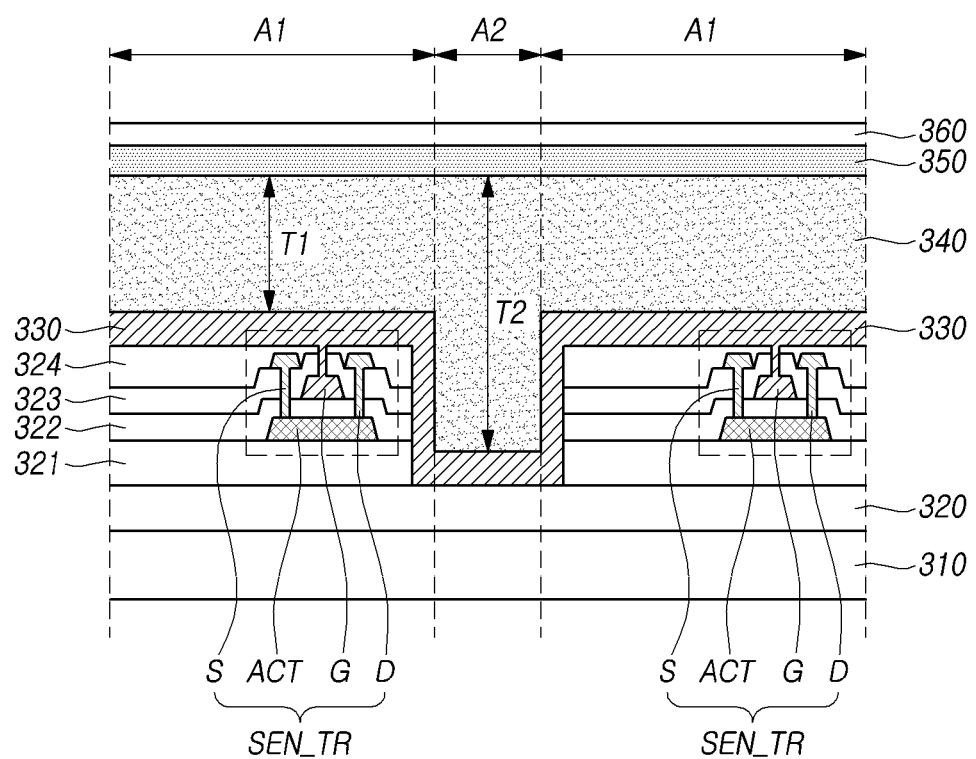
FIG. 3 is a cross-sectional view illustrating a sensing panel of the piezoelectric sensor according to one or more embodiments of the present disclosure.

FIG. 3 is a cross-sectional view of the sensing panel 200 of the piezoelectric sensor 10 according to one or more embodiments of the present disclosure.

Referring to FIG. 3, the piezoelectric sensor 10 according to the embodiment of the present disclosure includes a lower substrate 320, a plurality of sensing transistors SEN_TR that are disposed on the lower substrate 320, a lower electrode 330 that is disposed on the lower substrate 320 to cover the plurality of sensing transistors SEN_TR, a piezoelectric material layer 340 that is disposed on the lower electrode 330, and an upper electrode 350 that is disposed on the piezoelectric material layer 340.

The sensing panel 200 of the piezoelectric sensor 10 includes a plurality of first areas A1 that includes areas where the plurality of sensing transistors SEN_TR are disposed and a second area A2 that includes areas where the plurality of sensing transistors SEN_TR are not disposed.

In some embodiments, the plurality of first areas A1 correspond to the sensing pixels SP. In each of the plurality of first areas A1, one sensing transistor SEN_TR is disposed and one or more other transistors may be further disposed.

The plurality of first areas A1 are included in the sensing pixel area SPA, and the second area A2 is included in or superimposed on the sensing pixel area SPA.

A stacked structure in which the sensing transistors SEN_TR are formed in the sensing pixel area SPA will be described below. Each sensing transistor SEN_TR includes a source electrode S, a drain electrode D, a gate electrode G, and an active layer ACT.

A buffer layer 321 is disposed on the lower substrate 320. The active layer ACT is disposed on the buffer layer 321. A gate insulating film 322 is disposed on the active layer ACT.

The gate electrode G is disposed on the gate insulating film 322. An interlayer insulating film 323 is disposed on the gate insulating film 322 to partially cover the gate electrode G.

The source electrode S and the drain electrode D are disposed on the interlayer insulating film 323, and are connected to the active layer ACT via a contact hole CH of the interlayer insulating film 323 and the gate insulating film 322.

In the active layer ACT, a part superimposed on the gate electrode G is a part forming a channel. In the active layer ACT, the rest of the parts other than the part superimposed on the gate electrode G are parts to which the source electrode S and the drain electrode D are connected and are formed into a conductor.

A planarization layer 324 is disposed to cover the interlayer insulating film 323, the source electrode S, and the drain electrode D.

The lower electrode 330 is connected to the gate electrode G via a contact hole CH in the planarization layer 324 and the interlayer insulating film 323. Depending on a structure of a pixel circuit, the lower electrode 330 may be connected to the source electrode S or the drain electrode D via the contact hole in the planarization layer 324 and the interlayer insulating film 323.

Referring to FIG. 3, the piezoelectric material layer 340 included in the piezoelectric sensor 10 does not have a constant thickness at all positions.

The piezoelectric sensor 10 has a first thickness T1 in the plurality of first areas A1 in which the plurality of sensing transistors SEN_TR are disposed, and has a second thickness T2 which is the same or greater than the first thickness T1 in the second area A2 in which the plurality of sensing transistors SEN_TR are not disposed (T2≥T1).

Referring to FIG. 3, the piezoelectric sensor 10 further includes a lower coating layer 310 that is disposed under the lower substrate 320 and an upper coating layer 360 that is disposed to cover the upper electrode 350.

Referring to FIG. 3, in some embodiments, a substrate 21 included in the display panel 20 may be a stretchable substrate. The piezoelectric material layer 340 in the piezoelectric sensor 10 may be a stretchable layer including a flexible, pliable material. The lower coating layer 310 and the upper coating layer 360 include a flexible material and are stretchable. Accordingly, the display device according to one or more embodiments of the present disclosure can be implemented as a stretchable display.

In this specification, the term "stretchable" is defined to have a broad, comprehensive meaning that encompasses the terms flexible, pliable, bendable, foldable, and the like. For example, it includes the meaning of being able to be stretched, bended, folded and the capability of being contracted or restored to its default state before being stretched, bended, or folded. It also includes the state of being temporarily deformed in any shape or manner and being restored back into a state prior to deformation.

In the second area A2 in which the plurality of sensing transistors SEN_TR are not disposed, at least one hole (see 330_H in FIG. 4) is formed in the lower electrode 330 and at least one hole (see 350_H in FIG. 4) is formed in the upper electrode 350.

Flexibility of the piezoelectric sensor 10 is provided by at least one hole (see 330_H in FIG. 4) formed in the lower electrode 330 and at least one hole (see 350_H in FIG. 4) formed in the upper electrode 350.

The number of holes (see 330_H in FIG. 4) formed in the lower electrode 330 and the number of holes (see 330_H in FIG. 4) formed in the lower electrode 330 may be the same as each other or different from each other. The holes (see 330_H in FIG. 4) formed in the lower electrode 330 and the holes (see 350_H in FIG. 4) formed in the upper electrode 350 may be the same as each other in size, dimension, pattern, position, shape, and the like.

In some embodiments, the holes (see 330_H in FIG. 4) formed in the lower electrode 330 and the holes (see 350_H in FIG. 4) formed in the upper electrode 350 may be different from each other in size, dimension, pattern, position, shape, and the like.

The lower electrode 330 is a single metal electrode which is unified. However, the lower electrode 330 may be divided into a plurality of electrodes. The plurality of electrodes of the lower electrode 330 may be located to correspond to the areas of the plurality of sensing pixels SP.

The upper electrode 350 is a single metal electrode which is unified. However, the upper electrode 350 may be divided into a plurality of electrodes. The plurality of electrodes of the upper electrode 350 may be located to correspond to the areas of the plurality of sensing pixels SP.

Figure 4:
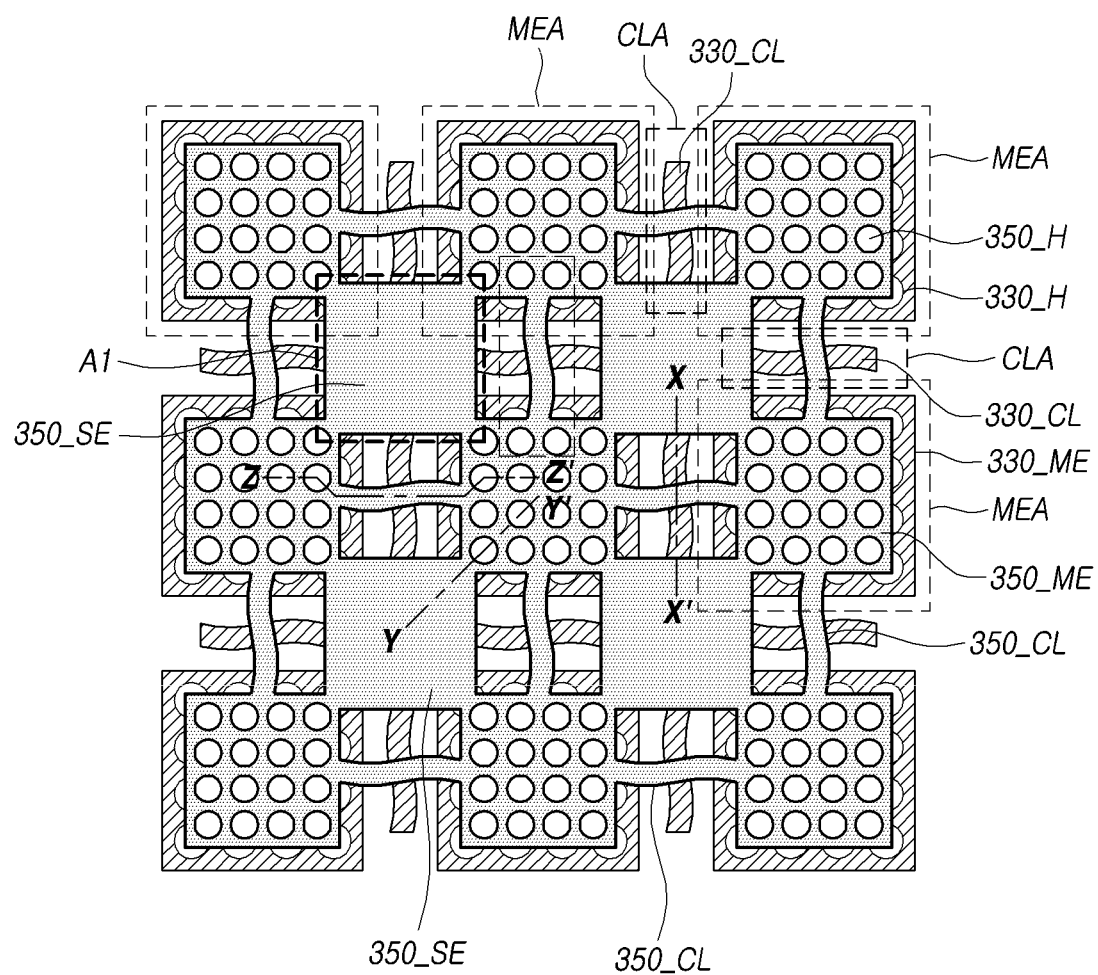
FIG. 4 is a top view illustrating the sensing panel of the piezoelectric sensor according to one or more embodiments of the present disclosure.
Figure 5:
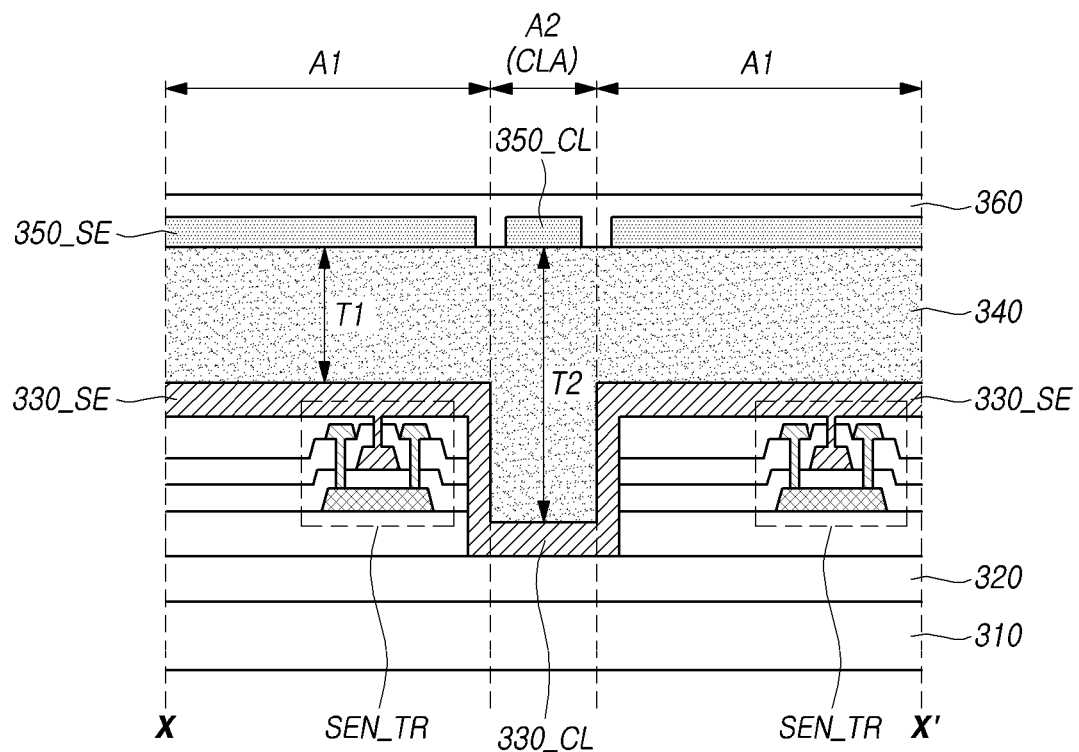
FIGS. 5 to 7 are cross-sectional views of the sensing panel illustrated in FIG. 4.
Figure 6:
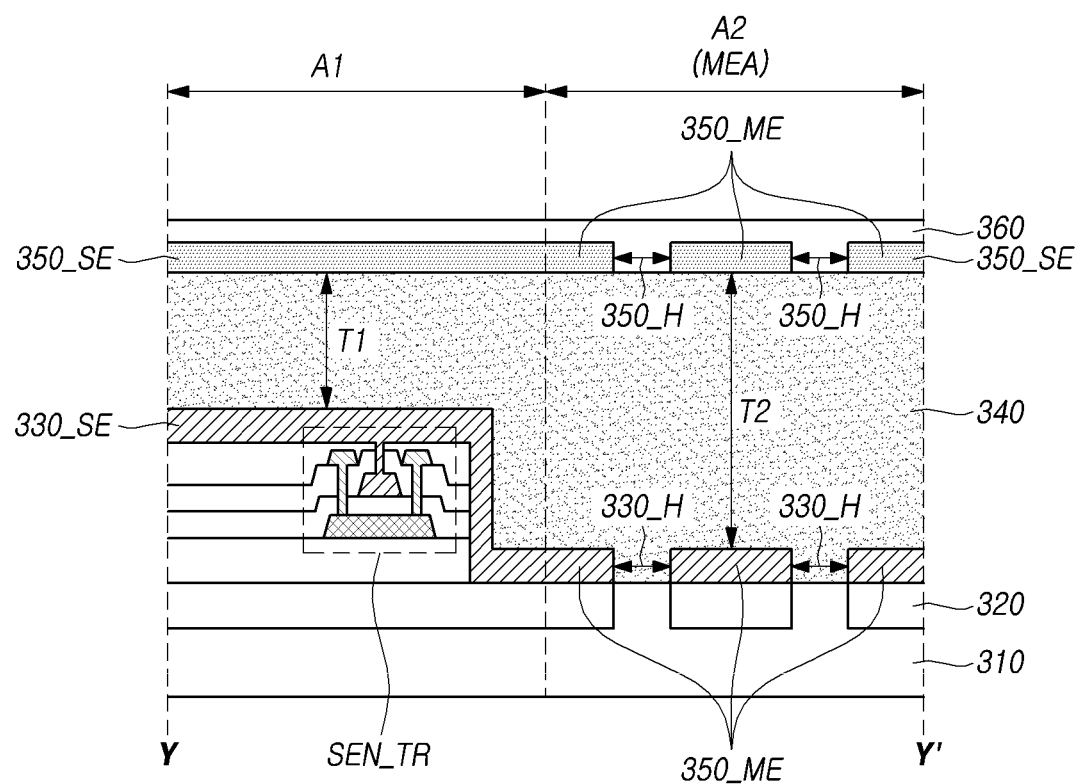
Figure 7:
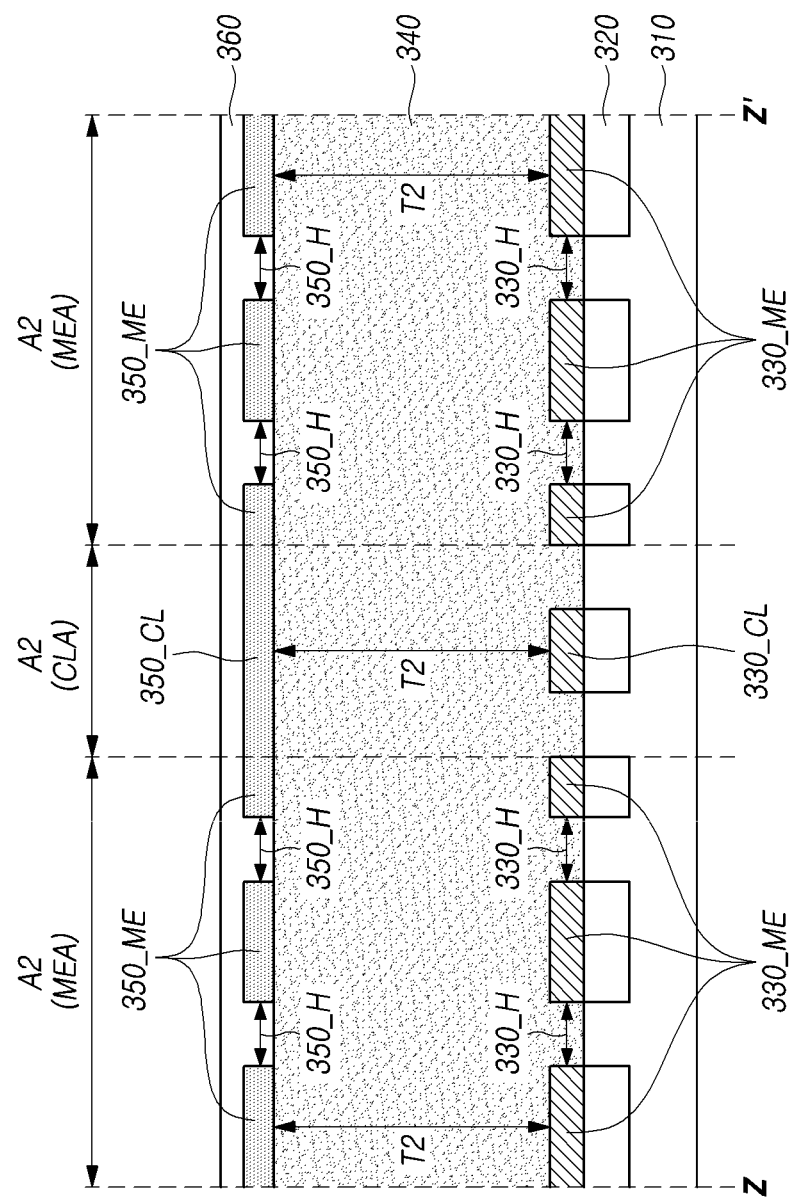
Figure 8:
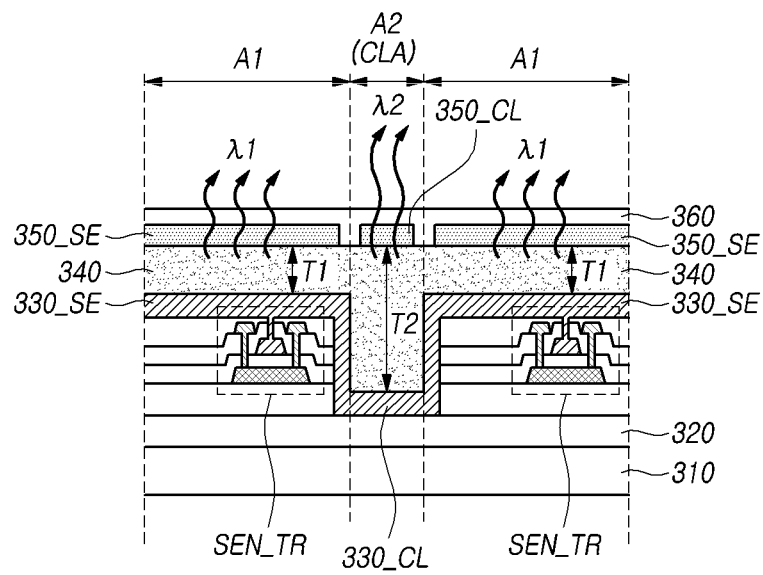
FIG. 8 is a diagram illustrating a case in which the piezoelectric sensor has contracted and a case in which the piezoelectric sensor has stretched according to one or more embodiments of the present disclosure.
Figure 8:
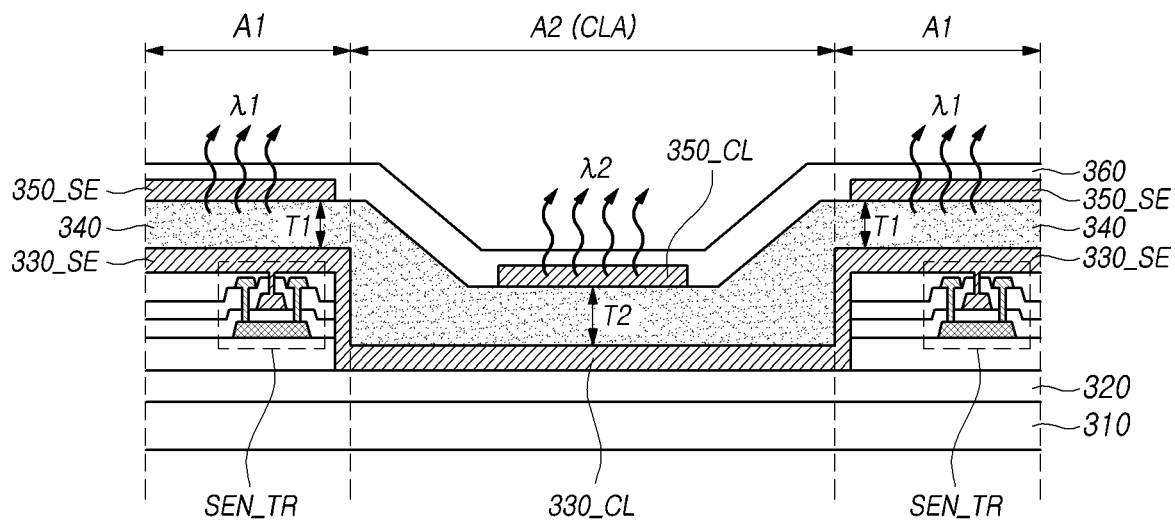

FIG. 4 is a top view illustrating the sensing panel 200 of the piezoelectric sensor 10 according to one or more embodiments of the present disclosure. FIGS. 5 to 7 are cross-sectional views of the sensing panel 200 illustrated in FIG. 4. FIG. 8 is a diagram illustrating a case in which the piezoelectric sensor 10 has contracted and a case in which the piezoelectric sensor 10 has stretched according to the embodiment of the present disclosure.

Referring to FIGS. 4 to 7, the sensing panel 200 includes the plurality of first areas A1 and the second area A2 which is the rest of the area other than the plurality of first areas A1.

Referring to FIGS. 4 to 7, a sensing pixel SP including a sensing transistor SEN_TR is disposed in each of the plurality of first areas A1.

Referring to FIGS. 4 to 7, the second area A2 other than the plurality of first areas A1 includes a plurality of metal electrode areas MEA and a plurality of connection line areas CLA that are located between the plurality of metal electrode areas MEA.

FIG. 5 is a cross-sectional view (along X-X') of a part including two first areas A1 and a connection line area CLA between the two first areas A1. FIG. 6 is a cross-sectional view (along Y-Y') of a part including two first areas A1 and one metal electrode area MEA. FIG. 7 is a cross-sectional view (along Z-Z') of a part including two metal electrode areas MEA and a connection line area CLA between the two metal electrode area MEA.

Referring to FIGS. 4 to 7, the upper electrode 350 includes a plurality of upper sensor electrode portions 350_SE, a plurality of upper mesh electrode portions 350_ME, and a plurality of upper connection lines 350_CL. The lower electrode 330 includes a plurality of lower sensor electrode portions 330_SE, a plurality of lower mesh electrode portions 330_ME, and a plurality of lower connection lines 330_CL.

Referring to FIGS. 4 to 7, the upper sensor electrode portion 350_SE of the upper electrode 350 or the lower sensor electrode portion 330_SE of the lower electrode 330 is disposed in each of the plurality of first areas A1.

Referring to FIGS. 4 to 7, the upper mesh electrode portion 35_ME of the upper electrode 350 or the lower mesh electrode portion 330_ME of the lower electrode 330 is disposed in each of the plurality of metal electrode areas MEA. The upper connection line 350_CL of the upper electrode 350 or the lower connection line 330_CL of the lower electrode 330 is disposed in each of the connection line areas CLA in the second area A2.

Referring to FIGS. 4 to 7, the plurality of upper sensor electrode portions 350_SE of the upper electrode 350 are disposed in the plurality of first areas A1 in which the plurality of sensing transistors SEN_TR are disposed and can be located on the plurality of sensing transistors SEN_TR. The plurality of upper mesh electrode portions 350_ME of the upper electrode 350 are disposed in the second area A2 in which the plurality of sensing transistors SEN_TR are not disposed, and a plurality of holes 350_H are disposed therein. The plurality of upper connection lines 350_CL of the upper electrode 350 are disposed in the second area A2 in which the plurality of sensing transistors SEN_TR are not disposed, and can electrically connect the plurality of upper sensor electrode portions 350_SE.

Referring to FIGS. 4 to 7, the plurality of lower sensor electrode portions 330_SE of the lower electrode 330 are disposed in the plurality of first areas A1 in which the plurality of sensing transistors SEN_TR are disposed and can be located under the plurality of sensing transistors SEN_TR. In the lower electrode 330, the plurality of lower mesh electrode portions 330_ME are disposed in the second area A2 in which the plurality of sensing transistors SEN_TR are not disposed, and a plurality of holes 330_H can be formed therein. In the lower electrode 330, the plurality of lower connection lines 330_CL are disposed in the second area A2 in which the plurality of sensing transistors SEN_TR are not disposed and can electrically connect the plurality of lower sensor electrode portions 330_SE.

Referring to FIGS. 6 and 7, in the second area A2 in which the plurality of sensing transistors SEN_TR are not disposed, at least one hole 330_H is formed in each lower mesh electrode portion 330_ME of the lower electrode 330, and at least one hole 350_H is formed in each upper mesh electrode portion 350_ME of the upper electrode 350_ME. In this case, at least one hole 350_H formed in each upper mesh electrode portion 350_ME of the upper electrode 350_ME and at least one hole 330_H formed in each lower mesh electrode portion 330_ME of the lower electrode 330 correspond to each other in position.

Referring to FIGS. 6 and 7, a part of the piezoelectric material layer 340 is inserted into at least one hole 330_H formed in the lower electrode 330.

When the piezoelectric sensor 10 contracts or stretches, the second thickness T2 of the piezoelectric material layer 340 varies.

Referring to FIG. 8, when the piezoelectric sensor 10 contracts, the second thickness T2 of the piezoelectric material layer 340 increases, and the first thickness T1 of the piezoelectric material layer 340 does not vary or increases slightly.

When the piezoelectric sensor 10 stretches, the second thickness T2 of the piezoelectric material layer 340 decreases and the first thickness T1 of the piezoelectric material layer 340 does not vary or decreases slightly.

Referring to FIG. 8, when the piezoelectric sensor 10 contracts or stretches, an amount of change of the second thickness T2 of the piezoelectric material layer 340 is greater than an amount of change of the first thickness T1 of the piezoelectric material layer 340.

Referring to FIG. 8, ultrasonic waves which are generated in at least one of the plurality of first areas A1 have a first wavelength λ1 and ultrasonic waves which are generated in the second area A2 has a second wavelength λ2.

The wavelength of ultrasonic waves which are generated in the piezoelectric material layer 340 is proportional to the thickness of the piezoelectric material layer 340.

When the second thickness of the piezoelectric material layer in the second area A2 is greater than the first thickness of the piezoelectric material layer in the plurality of first areas A1, the second wavelength λ2 of ultrasonic waves generated in the second area A2 is greater than the first wavelength λ1 of ultrasonic waves generated in at least one of the plurality of first areas A1.

The second wavelength λ2 of ultrasonic waves generated in the second area A2 is greater than the first wavelength λ1 of ultrasonic waves generated in at least one of the plurality of first areas A1. The first wavelength λ1 of ultrasonic waves generated in at least one of the plurality of first areas A1 is less than the second wavelength λ2 of ultrasonic waves generated in the second area A2.

Referring to FIG. 8, the second wavelength λ2 of ultrasonic waves generated in the second area A2 is variable according to contraction or stretch of the piezoelectric sensor 10. For example, the second wavelength λ2 of ultrasonic waves generated in the second area A2 varies based on the degree or amount of contraction or stretch of the piezoelectric sensor 10.

Referring to FIG. 8, when the piezoelectric sensor 10 stretches, the second wavelength λ2 of ultrasonic waves generated in the second area A2 decreases. When the piezoelectric sensor 10 contracts, the second wavelength λ2 of ultrasonic waves generated in the second area A2 increases.

The maximum value of the second wavelength λ2 of ultrasonic waves generated in the second area A2 is the second wavelength λ2 of ultrasonic waves generated in the second area A2 when the piezoelectric sensor 10 contracts to the maximum.

The minimum value of the second wavelength λ2 of ultrasonic waves generated in the second area A2 is the second wavelength λ2 of ultrasonic waves generated in the second area A2 when the piezoelectric sensor 10 stretches to the maximum. The minimum value of the second wavelength λ2 of ultrasonic waves generated in the second area A2 is greater than the first wavelength λ1 of ultrasonic waves generated in the first areas A1.

Figure 9:
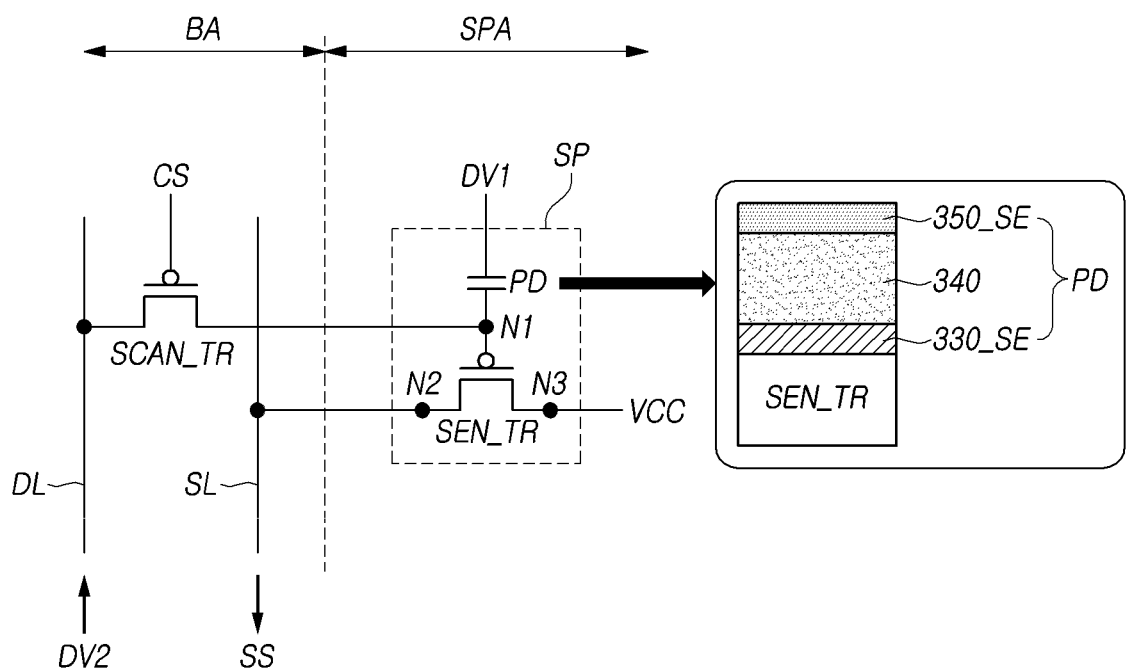
FIG. 9 is an equivalent circuit diagram illustrating a sensing pixel in the sensing panel of the piezoelectric sensor according to one or more embodiments of the present disclosure.
Figure 10:
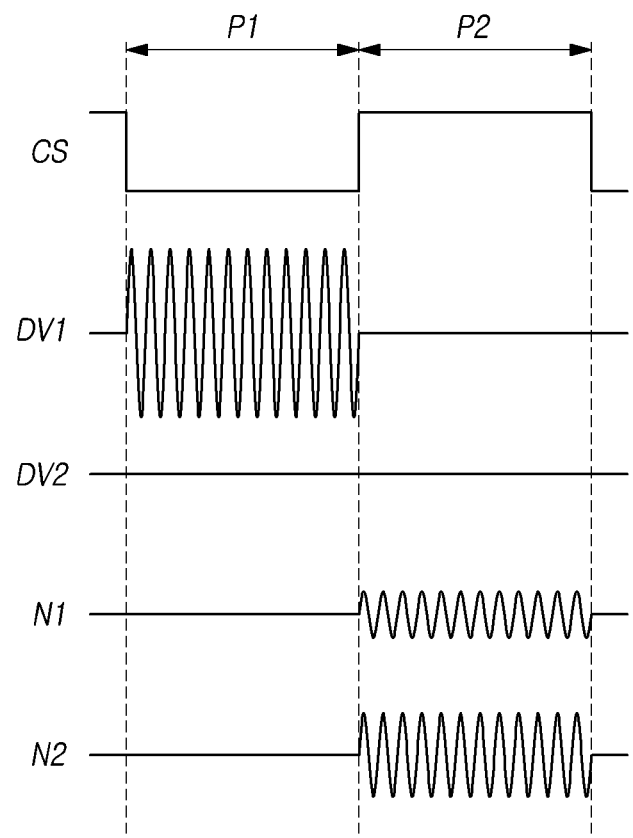
FIG. 10 is a signal timing diagram illustrating a case in which sensing is performed using the sensing pixel in the sensing panel of the piezoelectric sensor according to one or more embodiments of the present disclosure.

FIG. 9 is an equivalent circuit diagram illustrating a sensing pixel SP in the sensing panel 200 of the piezoelectric sensor 10 according to one or more embodiments of the present disclosure. FIG. 10 is a signal timing diagram illustrating a case in which sensing is performed using the sensing pixels SP in the sensing panel 200 of the piezoelectric sensor 10 according to one or more embodiments of the present disclosure.

Referring to FIG. 9, one sensing pixel SP includes a piezoelectric element PD and a pixel circuit that operates the piezoelectric element PD. The pixel circuit includes a sensing transistor SEN_TR.

The piezoelectric element PD includes an upper sensor electrode portion 350_SE of the upper electrode 350, a lower sensor electrode portion 330_SE of the lower electrode 330, and a piezoelectric material layer 340 that is disposed between the upper sensor electrode portion 350_SE and the lower sensor electrode portion 330_SE.

The piezoelectric element PD is located on the sensing transistor SEN_TR in view of a vertical structure.

A first drive voltage DV1 is applied to the upper electrode 350 of the piezoelectric element PD.

The lower electrode 350 of the piezoelectric element PD is electrically connected to a first node N1.

The gate electrode of the sensing transistor SEN_TR is electrically connected to the first node N1. The source electrode or the drain electrode of the sensing transistor SEN_TR is electrically connected to a second node N2. The drain electrode or the source electrode of the sensing transistor SEN_TR is electrically connected to a third node N3.

The first node N1 is connected to the lower electrode of the piezoelectric element PD and the gate electrode of the sensing transistor SEN_TR. The second node N2 is connected to the source electrode or the drain electrode of the sensing transistor SEN_TR and is electrically connected to a sensing line SL. The third node N3 can be supplied with a source voltage VCC.

The piezoelectric sensor 10 includes a scan transistor SCAN_TR including a drain electrode (or a source electrode) that is electrically connected to the first node N1, a source electrode (or a drain electrode) that is electrically connected to a drive line DL, and a gate electrode which is supplied with a sensing control signal CS.

The drive line DL is a line that transmits a second drive voltage DV2.

The scan transistor SCAN_TR is disposed in the bezel area BA which is a peripheral area of the sensing pixel area SPA.

The operation of the piezoelectric sensor 10 will be described below in brief.

When a drive signal with a variable voltage level is applied to the upper electrode 350 or the lower electrode 330, ultrasonic waves are generated in the piezoelectric material layer 340.

The ultrasonic waves generated in the piezoelectric material layer 340 are reflected by the surroundings (for example, a finger and a palm) and are delivered to the piezoelectric sensor 10.

The state of the piezoelectric material layer 340 changes due to the delivered ultrasonic waves. Accordingly, an electrical state of the lower electrode 330 or the upper electrode 350 changes.

With the change in electrical state of the lower electrode 330 or the upper electrode 350, at least one of the plurality of sensing transistors SEN_TR is repeatedly turned on and off and outputs an electrical signal to the sensing line SL.

The sensing circuit 210 drives the upper electrode 350 using the first drive voltage DV1, drives the lower electrode 330 using the second drive voltage DV2, detects an electrical signal via the sensing line SL connected to at least one of the plurality of sensing transistors SEN_TR, and detects biometric information on the basis of the detected electrical signal SS. For example, the biometric information may be information one or more of fingerprint, palm line, and blood vessel, or any other suitable biometric information capable of distinguishing one individual to another.

The sensing pixel SP generates ultrasonic waves by driving the upper electrode 350 or the lower electrode 330 of the piezoelectric element PD, and outputs an electrical signal SS to the sensing line SL on the basis of change in an electrical state of the lower electrode 330 of the piezoelectric element PD due to the ultrasonic waves.

Referring to FIG. 10, the sensing pixel SP is divisionally driven in a first period P1 in which ultrasonic waves are generated and a second period P2 in which ultrasonic waves are received and sensed.

In the first period P1, the scan transistor SCAN_TR is turned on by a sensing control signal CS with a voltage of a turn-on level. In the second period P2, the scan transistor SCAN_TR is turned off by a sensing control signal CS with a voltage of a turn-off level. Here, in the example illustrated in FIG. 9, since the scan transistor SCAN_TR is of a P type, the voltage of the turn-on level of the sensing control signal CS is a low-level voltage and the voltage of the turn-off level of the sensing control signal CS is a high-level voltage. The scan transistor SCAN_TR may be of an N type. In this case, the voltage of the turn-on level of the sensing control signal CS is a high-level voltage and the voltage of the turn-off level of the sensing control signal CS is a low-level voltage.

In the first period P1, a first drive voltage DV1 is applied to the upper electrode 350 of the piezoelectric element PD. The first drive voltage DV1 may be a voltage with a voltage level varying (hereinafter referred to as an AC voltage). For example, the first drive voltage DV1 may be an AC voltage that swings between −100 V and +100 V.

In the first period P1, a second drive voltage DV2 with a voltage or waveform other than that of the first drive voltage DV1 is applied to the first node N1 via the scan transistor SCAN_TR which is turned on by the sensing control signal CS.

The first node N1 is a node which is electrically connected to the lower electrode 330 of the piezoelectric element PD and electrically connected to the gate electrode of the sensing transistor SEN_TR. Accordingly, in the first period P1, the second drive voltage DV2 is applied to the lower electrode 330 of the piezoelectric element PD and the gate electrode of the sensing transistor SEN_TR.

In the first period P1, the second drive voltage DV2 is a DC voltage with a constant voltage level. In the first period P1, the second drive voltage DV2 includes a voltage level for turning off the sensing transistor SEN_TR.

In the first period P1, the second node N2 is in an electrical floating state.

Supply and control of the first drive voltage DV1 and the second drive voltage DV2 can be performed by the sensing circuit 210.

In the first period P1, the first drive voltage DV1 which is an AC voltage and the second drive voltage DV2 which is a DC voltage are applied to two electrodes 350 and 330 of the piezoelectric element PD and the piezoelectric material layer 340 vibrates to generate ultrasonic waves.

In the second period P2, the first drive voltage DV1 which is a DC voltage is applied to the upper electrode 350 of the piezoelectric element PD.

In the second period P2, the scan transistor SCAN_TR is turned off by the sensing control signal CS with a voltage of a turn-off level. Accordingly, the first node N1 is in the electrical floating state.

At this time, when ultrasonic waves generated in the first period P1 are reflected by the surroundings and transmitted into the piezoelectric sensor 10, the polarization state of the piezoelectric material layer 340 in the piezoelectric element PD is changed by the transmitted ultrasonic waves and thus the electrical state (e.g., the voltage level) of the lower electrode 330 of the piezoelectric element PD is changed. The change in the electrical state (e.g., the change in the voltage level) of the lower electrode 330 of the piezoelectric element PD is change in an electrical state (e.g., change in a voltage level) of the first node N5 and is change in an electrical state (e.g., change in a voltage level) of the gate electrode of the sensing transistor SEN_TR.

Depending on the change in the electrical state (e.g., the change in the voltage level) of the lower electrode 330 of the piezoelectric element PD, the electrical state (e.g., the voltage level) of the first node N1 changes and the sensing transistor SEN_TR is repeatedly turned on and off.

When the sensing transistor SEN_TR is repeatedly turned on and off, the source voltage VCC is transmitted to the second node N2 via the turned-on sensing transistor SEN_TR at the time at which the sensing transistor SEN_TR is turned on.

An electrical signal which is output from the piezoelectric element PD having received ultrasonic waves is amplified by the sensing transistor SEN_TR and is detected using the sensing line SL.

In some cases, a thin-film transistor may be additionally provided in the sensing pixel SP, and generation and sensing of ultrasonic waves may be performed by changing the voltage applied to the piezoelectric element PD.

Figure 11:
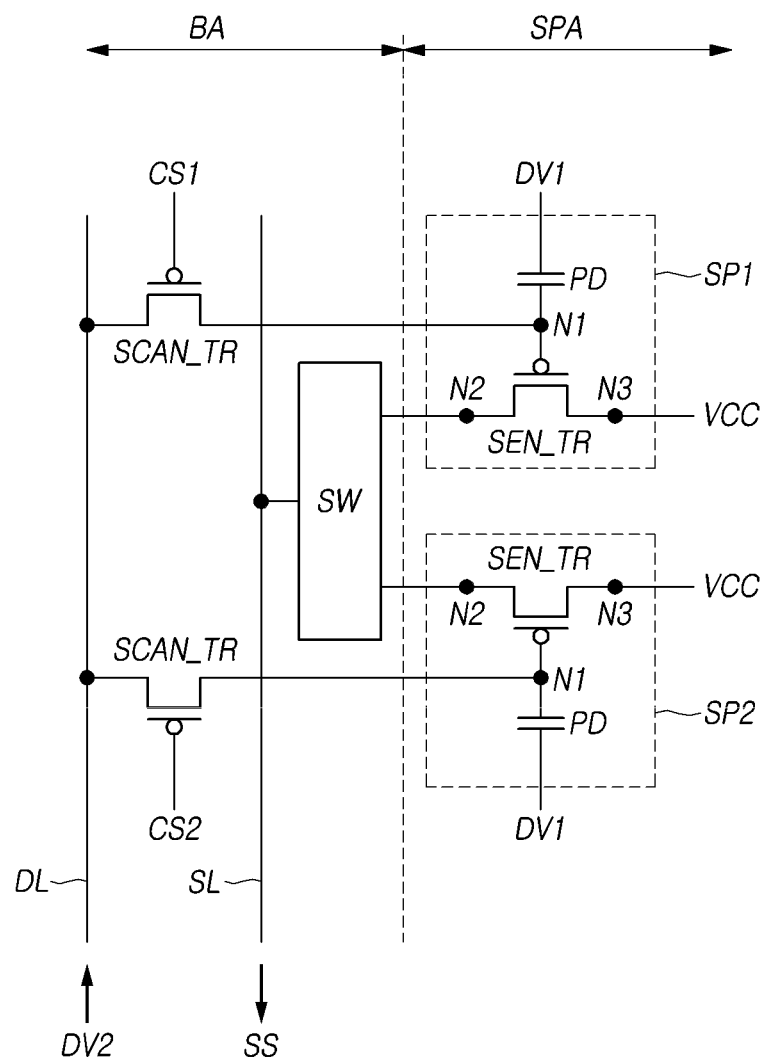
FIG. 11 is an equivalent circuit diagram illustrating a plurality of sensing pixels in the sensing panel of the piezoelectric sensor according to one or more embodiments of the present disclosure.

On the other hand, the transistors SEN_TR and SCAN_TR illustrated in FIGS. 9 to 11 are P-type transistors, but may be N-type transistors in other embodiments.

FIG. 11 is an equivalent circuit diagram of a plurality of sensing pixels SP1 and SP2 in the sensing panel 200 of the piezoelectric sensor 10 according to one or more embodiments of the present disclosure.

Referring to FIG. 11, the operating methods of the plurality of sensing pixels SP1 and SP2 are basically the same as the operating methods described above with reference to FIG. 10.

Referring to FIG. 11, in order to sequentially drive (operate in the drive period P1) the plurality of sensing pixels SP1 and SP2 of the piezoelectric sensor 10, the plurality of sensing pixels SP1 and SP2 are sequentially supplied with sensing control signals CS1 and CS2.

Referring to FIG. 11, in order to sequentially drive (operate in the drive period P2) the plurality of sensing pixels SP1 and SP2, second nodes N2 of the plurality of sensing pixels SP1 and SP2 are sequentially connected to the sensing line SL.

For this purpose, a selection circuit SW that selects one of the second nodes N2 of the plurality of sensing pixels SP1 and SP2 and connects the selected one to the sensing line SL is further provided.

The selection circuit SW may be disposed in the bezel area BA or may be disposed in the sensing pixel area SPA.

In some embodiments, the selection circuit SW includes one or more multiplexers. Alternatively, the selection circuit SW may include transistors which are connected to the second nodes N2 of the plurality of sensing pixels SP1 and SP2.

The piezoelectric sensor 10 according to the embodiment of the present disclosure and the display device including it will be described below in brief.

Figure 12:
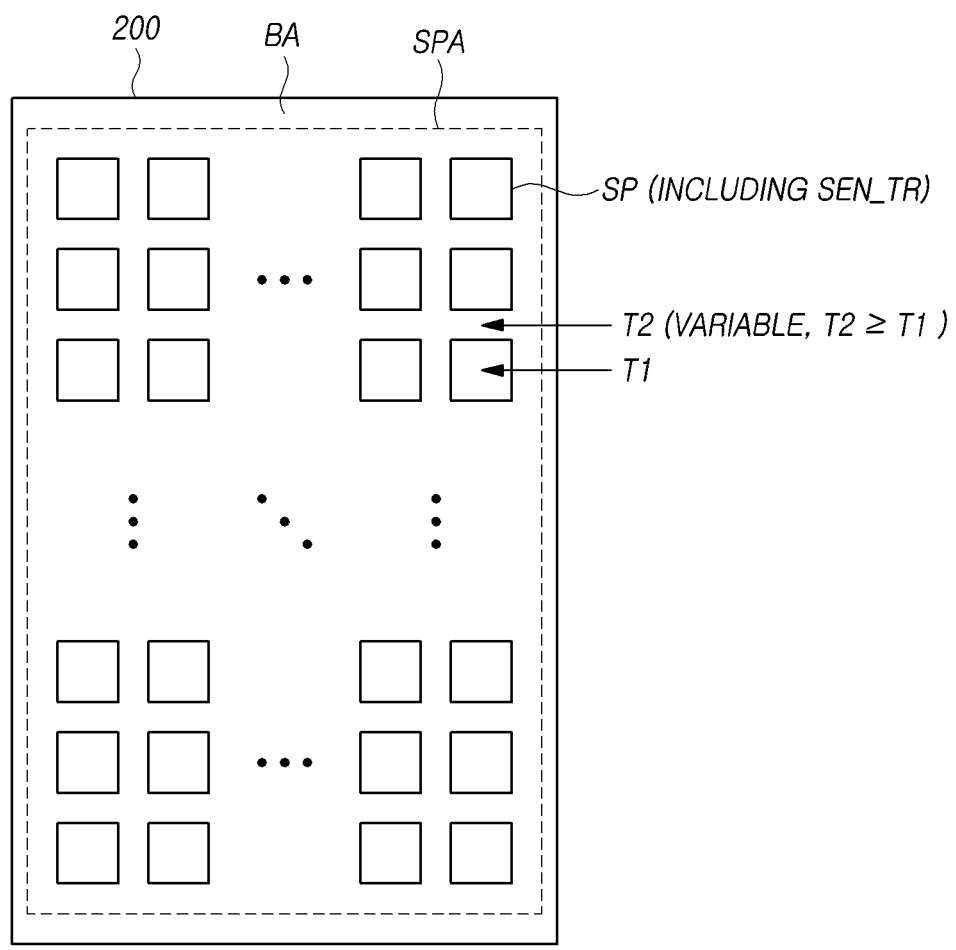
FIG. 12 is a diagram illustrating features of a thickness by positions of a piezoelectric material layer in the sensing panel of the piezoelectric sensor according to one or more embodiments of the present disclosure.

FIG. 12 is a diagram illustrating features of a thickness by positions of the piezoelectric material layer 340 in the sensing panel 200 of the piezoelectric sensor 10 according to one or more embodiments of the present disclosure Referring to FIG. 12, the sensing panel 200 of the piezoelectric sensor 10 according to the embodiment of the present disclosure includes a lower substrate 320, a plurality of sensing transistors SEN_TR that are disposed on the lower substrate 320, a lower electrode 330 that is disposed to cover the plurality of sensing transistors SEN_TR, a piezoelectric material layer 340 that is disposed on the lower electrode 330, and an upper electrode 350 that is disposed on the piezoelectric material layer 340.

Since the piezoelectric material layer 340 includes a stretchable material (such as a flexible material or the like), the holes 330_H are formed in the lower electrode 330, and the holes 350_H are formed in the upper electrode 350, the piezoelectric sensor 10 can contract or stretch.

When the piezoelectric sensor 10 contracts or stretches, the first thickness T2 of the piezoelectric material layer 340 in the first areas A1 in which the plurality of sensing transistors SEN_TR are disposed does not vary or may vary slightly.

When the piezoelectric sensor 10 contracts or stretches, the thickness T2 of the piezoelectric material layer 340 in the second area A2 in which the plurality of sensing transistors SEN_TR are not disposed varies.

When the piezoelectric sensor 10 contracts or stretches, an amount of change of the thickness T2 of the piezoelectric material layer 340 in the second area A2 in which the plurality of sensing transistors SEN_TR are not disposed may be greater than an amount of change of the first thickness T2 of the piezoelectric material layer 340 in the first areas A1 in which the plurality of sensing transistors SEN_TR are disposed.

As described above, since the thickness T2 of the piezoelectric material layer 340 in the second area A2 in which the plurality of sensing transistors SEN_TR are not disposed is greater than the first thickness T2 of the piezoelectric material layer 340 in the first areas A1 in which the plurality of sensing transistors SEN_TR are disposed, the piezoelectric sensor 10 can have flexibility in the second area A2 in which the plurality of sensing transistors SEN_TR are not disposed in consideration of the flexibility of the piezoelectric material layer 340.

In the sensing panel 200 of the piezoelectric sensor 10, the total area of the second area A2 in which the plurality of sensing transistors SEN_TR are not disposed is greater than the total area of the plurality of first areas A1 in which the plurality of sensing transistors SEN_TR are disposed. Accordingly, the piezoelectric sensor 10 has high stretchability, flexibility as a whole. Accordingly, the display device including the piezoelectric sensor 10 also has high stretchability, flexibility.

Figure 13:
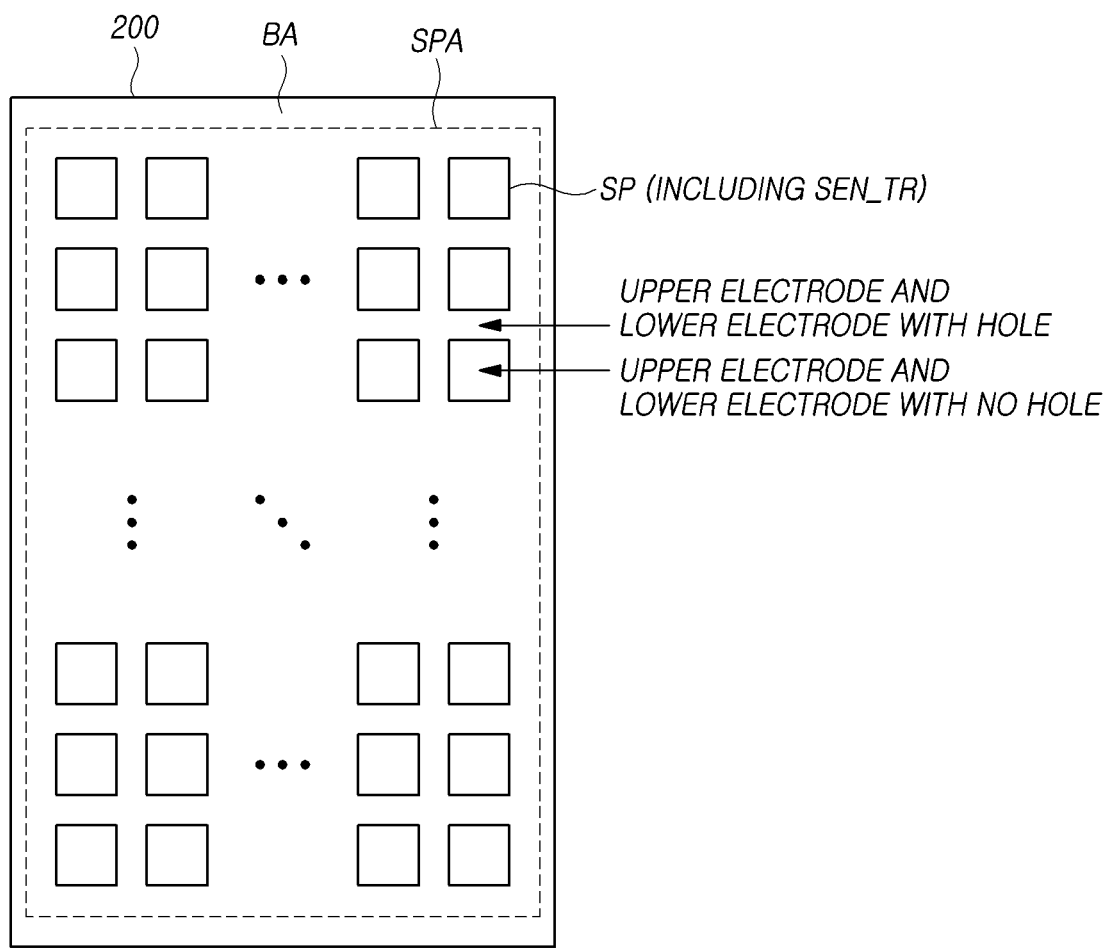
FIG. 13 is a diagram illustrating features of formation of holes by positions of an upper electrode and a lower electrode in the sensing panel of the piezoelectric sensor according to one or more embodiments of the present disclosure.

FIG. 13 is a diagram illustrating features of formation of the holes by positions of the upper electrode 350 and the lower electrode 330 in the sensing panel 200 of the piezoelectric sensor 10 according to one or more embodiments of the present disclosure.

Referring to FIG. 13, the sensing panel 200 of the piezoelectric sensor 10 according to the embodiment of the present disclosure includes a lower substrate 320, a plurality of sensing transistors SEN_TR that are disposed on the lower substrate 320, a lower electrode 330 that is disposed to cover the plurality of sensing transistors SEN_TR, a piezoelectric material layer 340 that is disposed on the lower electrode 330, and an upper electrode 350 that is disposed on the piezoelectric material layer 340.

Since the piezoelectric material layer 340 includes a stretchable material (such as a flexible material or the like), the holes 330_H are formed in the lower electrode 330, and the holes 350_H are formed in the upper electrode 350, the piezoelectric sensor 10 can contract or stretch.

In addition, the piezoelectric sensor 10 can be made to contract and stretch better due to the hole structures of the lower electrode 330 and/or the upper electrode 350.

In the areas A1 in which the plurality of sensing transistors SEN_TR are disposed, no hole 330_H is formed in the lower electrode 330 and no hole 350_H is formed in the upper electrode 350.

In the second area A2 in which the plurality of sensing transistors SEN_TR are not disposed, at least one hole 330_H is formed in the lower electrode 330 or at least one hole 350_H is formed in the upper electrode 350.

Figure 14:
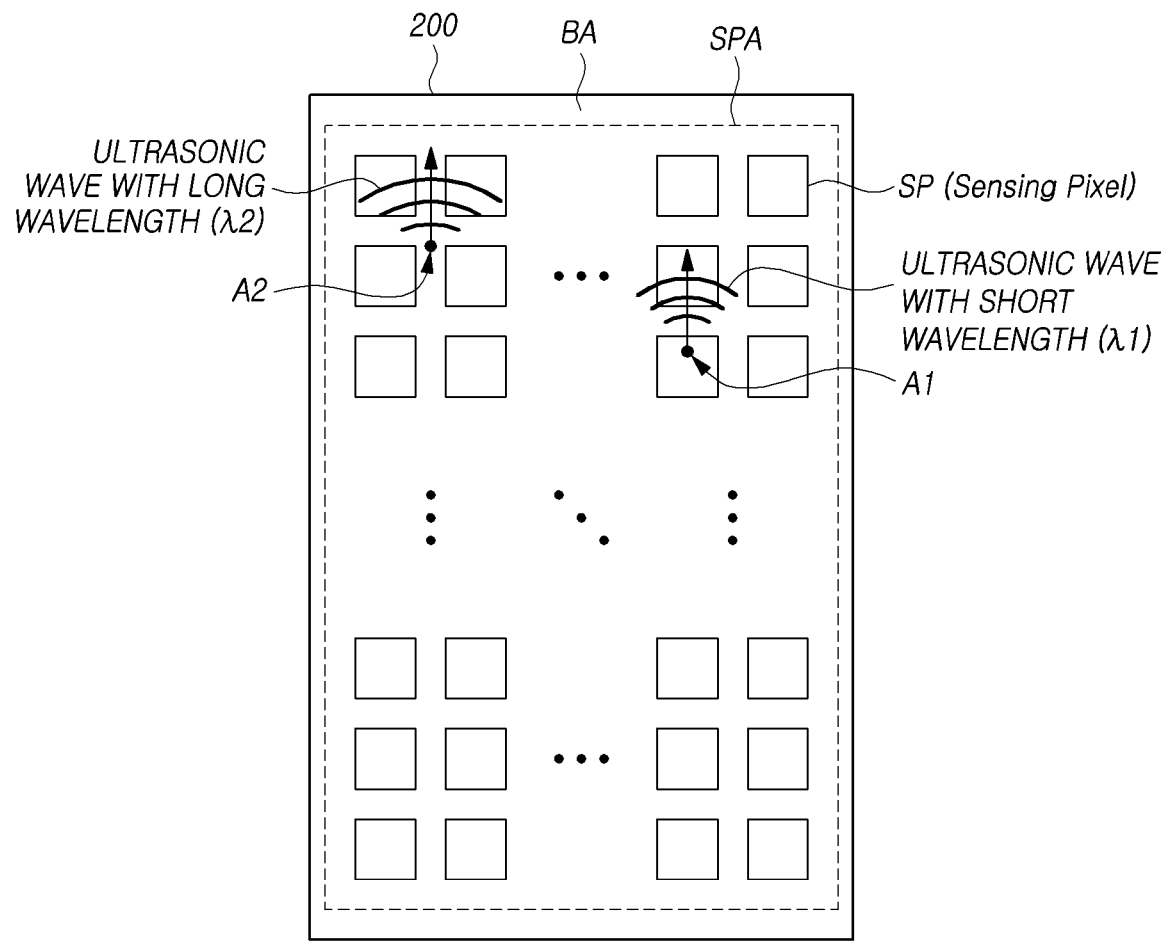
FIG. 14 is a diagram illustrating features of a wavelength by positions of an ultrasonic signal in the sensing panel of the piezoelectric sensor according to one or more embodiments of the present disclosure.

FIG. 14 is a diagram illustrating features of a wavelength by positions of an ultrasonic signal in the sensing panel 200 of the piezoelectric sensor 10 according to one or more embodiments of the present disclosure.

Referring to FIG. 14, the sensing panel 200 of the piezoelectric sensor 10 according to the embodiment of the present disclosure includes a lower substrate 320, a plurality of sensing transistors SEN_TR that are disposed on the lower substrate 320, a lower electrode 330 that is disposed to cover the plurality of sensing transistors SEN_TR, a piezoelectric material layer 340 that is disposed on the lower electrode 330, and an upper electrode 350 that is disposed on the piezoelectric material layer 340.

The wavelength $\lambda 1$ of ultrasonic waves generated in the first areas A1 in which the plurality of sensing transistors SEN_TR are disposed may be different from the wavelength $\lambda 2$ of ultrasonic waves generated in the area A2 in which the plurality of sensing transistors SEN_TR are not disposed.

The thickness T2 of the piezoelectric material layer 340 in the area A2 in which the plurality of sensing transistors SEN_TR are not disposed is greater than the first thickness T2 of the piezoelectric material layer 340 in the areas A1 in which the plurality of sensing transistors SEN_TR are disposed.

The wavelength of ultrasonic waves is proportional to the thickness of the piezoelectric material layer 340.

Accordingly, the wavelength $\lambda 2$ of ultrasonic waves generated in the area A2 in which the plurality of sensing transistors SEN_TR are not disposed is longer than the wavelength $\lambda 1$ of ultrasonic waves generated in the areas A1 in which the plurality of sensing transistors SEN_TR are disposed.

In general, diffraction of ultrasonic waves occurs better as the wavelength of ultrasonic waves increases. Diffraction of ultrasonic waves occurs less as the wavelength of ultrasonic waves decreases.

Accordingly, depending on the wavelength of ultrasonic waves generated in the piezoelectric sensor 10, ultrasonic waves with a small wavelength may be reflected by the skin of a body (for example, a finger, a palm, or a wrist) or may be reflected by the inside of the body.

Accordingly, as the wavelengths of ultrasonic waves generated in the piezoelectric sensor 10 are not constant but become diverse, the piezoelectric sensor 10 can detect various types of biometric information (for example, fingerprint, palm lines, or blood vessel shapes). Accordingly, the display device can provide various application functions using various types of biometric information.

As the wavelengths of ultrasonic waves generated in the piezoelectric sensor 10 become diverse, the piezoelectric sensor 10 can more accurately and finely detect biometric information. For example, even when a fingerprint is very weak, the piezoelectric sensor 10 can accurately and finely detect a fingerprint, which cannot be detected using ultrasonic waves of short wavelengths, using ultrasonic waves of long wavelengths.

Figure 15:
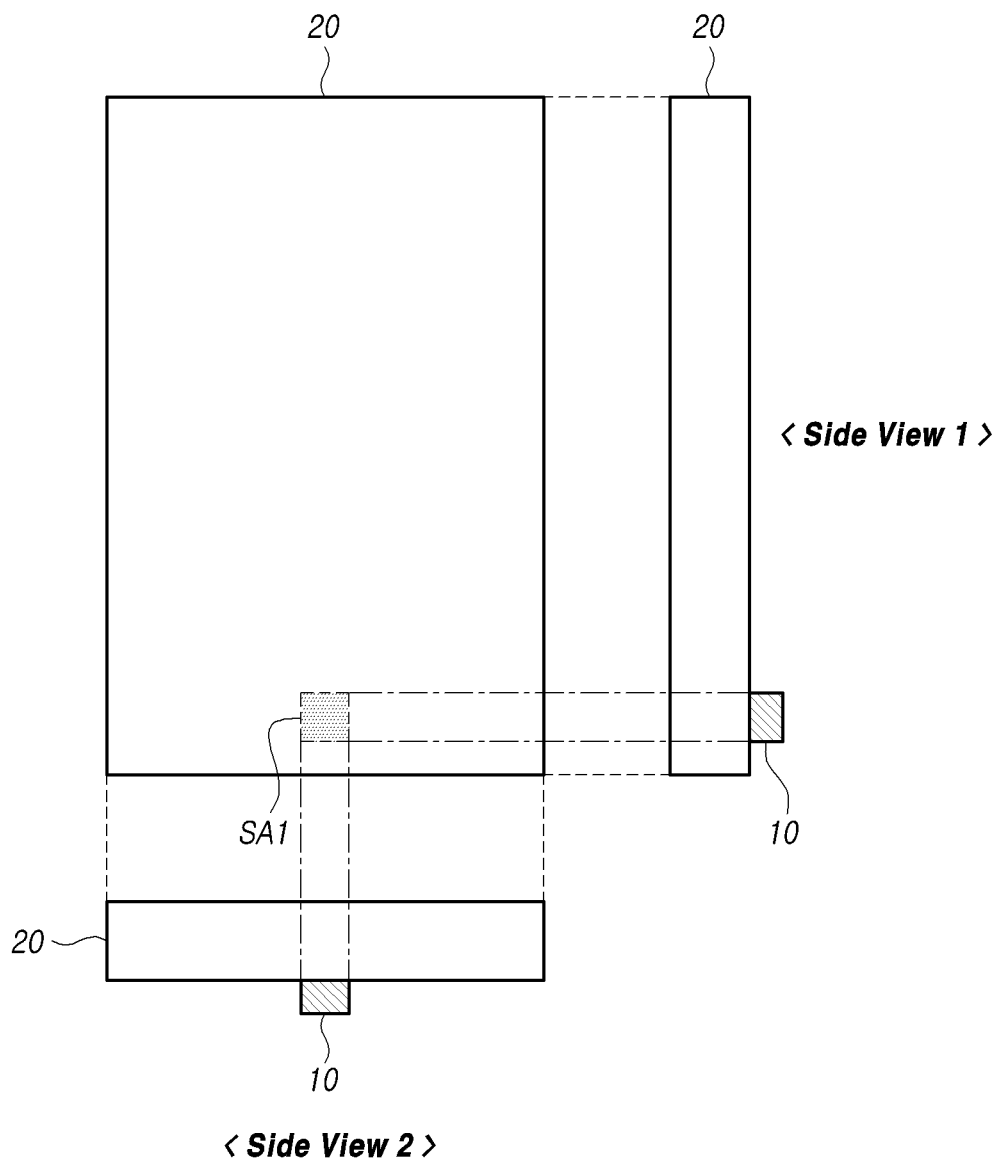
FIG. 15 is a diagram illustrating an example of a sensing area in a display device according to one or more embodiments of the present disclosure.
Figure 16:
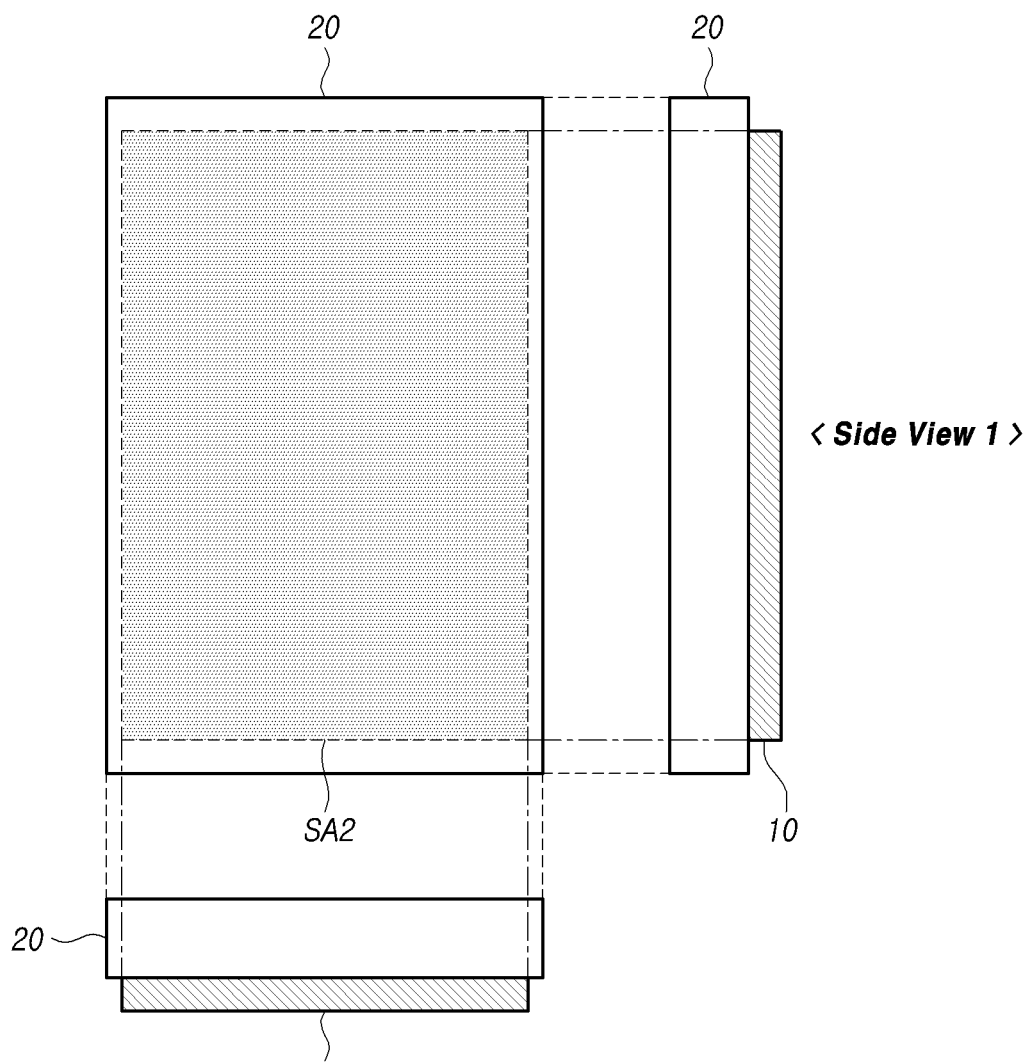
FIG. 16 is a diagram illustrating another example of a sensing area in a display device according to one or more embodiments of the present disclosure.

FIG. 15 is a diagram illustrating an example of the sensing area SA in the display device according to one or more embodiments of the present disclosure. FIG. 16 is a diagram illustrating another example of the sensing area SA in the display device according to one or more embodiments of the present disclosure. FIGS. 15 and 16 illustrate a top view and two side views (Side Views 1 and 2).

Referring to FIG. 15, the display device can detect biometric information of a user's body who comes into contact or gets close to a partial area SA1 of the display panel 20 using the piezoelectric sensor 10. In this case, the piezoelectric sensor 10 is disposed under the display panel 20 to correspond to the partial area SA1 of the display panel 20.

Referring to FIG. 16, the display device can detect biometric information of a user's body who comes into contact or gets close to the whole area SA2 of an image display area of the display panel 20 using the piezoelectric sensor 10. In this case, the piezoelectric sensor 10 is disposed under the display panel 20 to correspond to the whole area SA2 of the image display area of the display panel 20.

Even when the piezoelectric sensor 10 is disposed as illustrated in FIG. 16, biometric information can be detected from only a partial area of the whole area SA2 of the image display area of the display panel 20.

That is, the piezoelectric sensor 10 may perform sensing by driving all of the plurality of sensing pixels SP arranged in the sensing panel 200, or may perform sensing by driving only some of the plurality of sensing pixels SP arranged in the sensing panel 200.

According to the above embodiments of the present disclosure, it is possible to provide a piezoelectric sensor that can detect biometric information more accurately and finely with a structure enabling generation of ultrasonic waves of various wavelengths.

According to the embodiments of the present disclosure, it is possible to provide a display device that can accurately perform an application function requiring high security using a piezoelectric sensor that can detect biometric information more accurately and finely.

According to the embodiments of the present disclosure, it is possible to provide a piezoelectric sensor that can detect more types of biometric information accurately and finely with a structure enabling generation of ultrasonic waves of various wavelengths.

According to the embodiments of the present disclosure, it is possible to provide a display device that can accurately perform various application functions using a piezoelectric sensor that can detect more types of biometric information accurately and finely.

According to the embodiments of the present disclosure, it is possible to provide a stretchable piezoelectric sensor with a flexible structure.

According to the embodiments of the present disclosure, it is possible to provide a stretchable display device including a stretchable piezoelectric sensor with a flexible structure.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

LIST OF REFERENCE NUMERALS

10: Piezoelectric sensor
20: Display panel
200: Sensing panel
210: Sensing circuit
310: Lower coating layer
320: Lower substrate
330: Lower electrode
330_SE: Lower sensor electrode portion
330_ME: Lower mesh electrode portion
330_CL: Lower connection line portion
330_H: Hole
340: Piezoelectric material layer
350: Upper electrode
350_SE: Upper sensor electrode portion
350_ME: Upper mesh electrode portion
350_CL: Upper connection line portion
350_H: Hole
360: Upper coating layer The various embodiments described above can be combined to provide further embodiments. Other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A piezoelectric sensor comprising:
    a lower substrate, the lower substrate having a plurality of first areas, and a second area;
    a plurality of sensing transistors that are disposed on the lower substrate, wherein the plurality of sensing transistors are disposed within the respective plurality of first areas;
    a lower electrode that is disposed to cover the plurality of sensing transistors;
    a piezoelectric material layer that is disposed on the lower electrode; and
    an upper electrode that is disposed on the piezoelectric material layer,
    wherein the piezoelectric material layer has a first thickness in the plurality of first areas in which the plurality of sensing transistors are disposed and has a second thickness which is greater than the first thickness in the second area in which the plurality of sensing transistors are not disposed.

2. The piezoelectric sensor according to claim 1, wherein the second thickness of the piezoelectric material layer varies when the piezoelectric sensor contracts or stretches.

3. The piezoelectric sensor according to claim 2, wherein the second thickness of the piezoelectric material layer decreases when the piezoelectric sensor stretches and the second thickness of the piezoelectric material layer increases when the piezoelectric sensor contracts, and
    wherein an amount of change of the second thickness of the piezoelectric material layer is greater than an amount of change of the first thickness of the piezoelectric material layer when the piezoelectric sensor contracts or stretches.

4. The piezoelectric sensor according to claim 1, wherein ultrasonic waves which are generated in at least one of the plurality of first areas have a first wavelength and ultrasonic waves which are generated in the second area have a second wavelength which is different from the first wavelength, and
wherein the second wavelength of the ultrasonic waves generated in the second area is greater than the first wavelength of the ultrasonic waves generated in at least one of the plurality of first areas when the second thickness of the piezoelectric material layer in the second area is greater than the first thickness of the piezoelectric material layer in the plurality of first areas.

5. The piezoelectric sensor according to claim 4, wherein the second wavelength of the ultrasonic waves generated in the second area varies depending on a degree of contraction or stretch of the piezoelectric sensor.

6. The piezoelectric sensor according to claim 5, wherein the second wavelength of the ultrasonic waves generated in the second area decreases when the piezoelectric sensor stretches, and
wherein the second wavelength of the ultrasonic waves generated in the second area increases when the piezoelectric sensor contracts.

7. The piezoelectric sensor according to claim 1, wherein the piezoelectric material layer includes a flexible material, and
wherein the piezoelectric sensor further comprises:
a lower coating layer that is disposed under the lower substrate and includes a flexible material; and
an upper coating layer that is disposed to cover the upper electrode and includes a flexible material.

8. The piezoelectric sensor according to claim 1, wherein at least one hole is formed in the lower electrode or the upper electrode in the second area in which the plurality of sensing transistors are not disposed.

9. The piezoelectric sensor according to claim 8, wherein at least one hole is formed in the lower electrode or the upper electrode in the second area in which the plurality of sensing transistors are not disposed, and
wherein at least one hole which is formed in the upper electrode and at least one hole which is formed in the lower electrode correspond to each other in position.

10. The piezoelectric sensor according to claim 8, wherein a part of the piezoelectric material layer is inserted into at least one hole formed in the lower electrode.

11. The piezoelectric sensor according to claim 1, wherein the upper electrode includes:
a plurality of upper sensor electrode portions that are disposed in the plurality of first areas in which the plurality of sensing transistors are disposed and are located on the plurality of sensing transistors;
a plurality of upper mesh electrode portions that are disposed in the second area in which the plurality of sensing transistors are not disposed and a plurality of holes are formed; and
a plurality of upper connection line portions that are disposed in the second area in which the plurality of sensing transistors are not disposed and electrically connects the plurality of upper mesh electrode portions, and
wherein the lower electrode includes:
a plurality of lower sensor electrode portions that are disposed in the plurality of first areas in which the plurality of sensing transistors are disposed and are located under the plurality of sensing transistors;
a plurality of lower mesh electrode portions that are disposed in the second area in which the plurality of sensing transistors are not disposed and a plurality of holes are formed; and
a plurality of lower connection line portions that are disposed in the second area in which the plurality of sensing transistors are not disposed and electrically connects the plurality of lower sensor electrode portions.

12. The piezoelectric sensor according to claim 1, wherein ultrasonic waves are generated in the piezoelectric material layer when a drive signal with a variable voltage level is applied to the upper electrode or the lower electrode, and
wherein, when the ultrasonic waves generated in the piezoelectric material layer are reflected and transmitted to the piezoelectric sensor,
a state of the piezoelectric material layer is changed by the transmitted ultrasonic waves and an electrical state of the lower electrode or the upper electrode changes, and
at least one of the plurality of sensing transistors is repeatedly turned on and off to output an electrical signal to a sensing line according to the change in the electrical state of the lower electrode or the upper electrode.

13. The piezoelectric sensor according to claim 12, further comprising a sensing circuit that
drives the upper electrode or the lower electrode,
detects an electrical signal via the sensing line, and
detects biometric information on the basis of the detected electrical signal.

14. The piezoelectric sensor according to claim 1, wherein a total area of the second area in which the plurality of sensing transistors are not disposed is greater than a total area of the plurality of first areas in which the plurality of sensing transistors are disposed.

15. A display device comprising:
a display panel; and
a piezoelectric sensor adjacently disposed to the display panel, the piezoelectric sensor including:
a substrate having a first area and a second area that is different from the first area,
a plurality of sensing transistors that are disposed on the first area of the substrate, wherein the plurality of sensing transistors are not disposed on the second area,
a first electrode that is on the plurality of sensing transistors,
a piezoelectric material layer that is on the first electrode, and
a second electrode on the piezoelectric material layer,
wherein the piezoelectric material layer has a first thickness in the first area in which the plurality of sensing transistors are disposed and has a second thickness which is greater than the first thickness in the second area in which the plurality of sensing transistors are not disposed.

16. The display device according to claim 15, wherein the second thickness of the piezoelectric material layer varies when the piezoelectric sensor contracts or stretches.

17. The display device according to claim 15, wherein ultrasonic waves which are generated in the first area have a first wavelength and ultrasonic waves which are generated in the second area have a second wavelength which is different from the first wavelength, and
wherein the second wavelength of the ultrasonic waves generated in the second area is greater than the first wavelength of the ultrasonic waves generated in the first area when the second thickness of the piezoelectric material layer in the second area is greater than the first thickness of the piezoelectric material layer in the first area.

18. The display device according to claim 15, wherein the second wavelength of the ultrasonic waves generated in the second area varies depending on contraction or stretch of the piezoelectric sensor.

19. The display device according to claim 15, further comprising a sensing circuit that
   drives the first electrode or the second electrode,
   detects an electrical signal via a sensing line which is connected to at least one of the plurality of sensing transistors, and
   detects biometric information on the basis of the detected electrical signal.

20. The display device according to claim 15, wherein the display panel includes a stretchable substrate and the piezoelectric material layer is stretchable.

21. A piezoelectric sensor comprising:
   a lower substrate having a first area and a second area different from the first area;
   a plurality of sensing transistors that are disposed on the first area of the lower substrate, wherein the plurality of sensing transistors are not disposed on the second area;
   a lower electrode that is disposed to cover the plurality of sensing transistors;
   a piezoelectric material layer that is disposed on the lower electrode; and
   an upper electrode that is disposed on the piezoelectric material layer,
   wherein a thickness of the piezoelectric material layer in the second area in which the plurality of sensing transistors are not disposed varies when the piezoelectric sensor contracts or stretches.

22. A piezoelectric sensor comprising:
   a substrate having a first area and a second area different from the first area;
   a plurality of sensing transistors that are disposed on the first area of the substrate, wherein the plurality of sensing transistors are not disposed on the second area;
   a first electrode that is on the plurality of sensing transistors;
   a piezoelectric material layer that is on the first electrode; and
   a second electrode that is disposed on the piezoelectric material layer,
   wherein at least one hole structure is formed in the first electrode or the second electrode in the second area in which the plurality of sensing transistors are not disposed.

23. A piezoelectric sensor comprising:
   a substrate having a first area and a second area different from the first area;
   a plurality of sensing transistors that are disposed on the first area of the substrate;
   a first electrode that is on the plurality of sensing transistors;
   a piezoelectric material layer that is on the first electrode; and
   a second electrode that is on the piezoelectric material layer,
   wherein, the piezoelectric sensor in operation, generates ultrasonic waves,
   wherein a wavelength of ultrasonic waves which are generated in the first area in which the sensing transistors are disposed and a wavelength of ultrasonic waves which are generated in the second area in which the sensing transistors are not disposed are different from each other.

* * * * *